United States Patent [19]

Conn

[11] Patent Number: 6,005,829
[45] Date of Patent: Dec. 21, 1999

[54] METHOD FOR CHARACTERIZING INTERCONNECT TIMING CHARACTERISTICS

[75] Inventor: Robert O. Conn, Los Gatos, Calif.

[73] Assignee: Xilinx, Inc., San Jose, Calif.

[21] Appl. No.: 09/083,892

[22] Filed: May 21, 1998

Related U.S. Application Data

[63] Continuation of application No. 08/710,465, Sep. 17, 1996, Pat. No. 5,790,479.
[51] Int. Cl.$^6$ .............................. G04F 8/00; G01R 15/12; G01R 27/26
[52] U.S. Cl. .................. 368/118; 324/73.1; 324/658; 324/686; 327/46
[58] Field of Search .................................. 548/113, 118, 548/120; 327/261–267, 39, 45–47; 324/73.1, 76.41, 658, 681–686

[56] References Cited

U.S. PATENT DOCUMENTS

| Re. 34,363 | 8/1993 | Freeman ................................. 307/465 |
| 4,792,932 | 12/1988 | Bowhers et al. ........................ 368/113 |
| 4,795,964 | 1/1989 | Shetti ...................................... 324/60 |
| 4,878,209 | 10/1989 | Bassett et al. .......................... 368/113 |
| 4,890,270 | 12/1989 | Griffith ................................... 368/113 |
| 5,083,299 | 1/1992 | Schwanke et al. ..................... 368/113 |
| 5,294,559 | 3/1994 | Dcthimy ................................. 307/480 |
| 5,606,567 | 2/1997 | Agrawal et al. ....................... 371/22.4 |
| 5,625,288 | 4/1997 | Snider et al. ........................... 324/158 |

OTHER PUBLICATIONS

"Signal Delay in RC Tree Networks," IEEE Transactions on Computer–Aided Design, vol. CAD–2, No. 3, Jul. 1983, pp. 202–211.

Primary Examiner—Vit Miska
Attorney, Agent, or Firm—Arthur J. Behiel; Jeanette S. Harms

[57] ABSTRACT

A reference ring oscillator circuit (RROC) is used to determine timing characteristics of a test interconnect structure in an integrated circuit. The RROC includes an odd number of inverters coupled together in a ring manner and has defined test segments at which a test interconnect can be loaded. Reference timing characteristics of the unloaded RROC are determined according to a calibration method including the steps of: (a) directly measuring signal propagation delay through each segment of the RROC; (b) modeling each test segment using an RC tree type reference circuit model having reference elements; (c) simulating the reference circuit model to provide a functional relationship between two reference capacitors; (d) defining upper and lower bounds for propagation delay through the test segment in terms of the reference elements; (e) determining values for the reference capacitor elements; and (f) measuring a reference frequency of oscillation of the unloaded RROC. After calibration, a test frequency of oscillation of the RROC is measured while a test interconnect structure is loaded onto a test segment. The period of the reference frequency is subtracted from the period of the test frequency. A time difference between the two periods is attributed to increased signal propagation delay through the RROC as a result of loading the test interconnect structure onto the test segment. Based on the measured time difference and determined reference timing characteristics of the test segment, timing characteristics of the test interconnect structure are determined.

10 Claims, 8 Drawing Sheets

METHOD FOR CHARACTERIZING INTERCONNECT TIMING CHARACTERISTICS

RELATED APPLICATION

This application is a continuation application of U.S. patent application Ser. No. 08/710,465 entitled "Method for Characterizing Interconnect Timing Characteristics Using Reference Ring Oscillator Circuit" filed Sep. 17, 1996, now U.S. Pat. No. 5,790,479, which is incorporated herein by reference.

BACKGROUND OF THE INVENTION

1. Field of the Invention

The present invention pertains to a method for measuring time characteristics of an interconnect structure within an integrated circuit. More particularly, the present invention relates to a method for characterizing the distributed resistance and capacitance associated with interconnect structures in integrated circuits.

2. Background Technology

Distributed resistance and capacitance of interconnect structures in an integrated circuit (IC) cause signal propagation delays through the IC. Because signal propagation delays slow down the functioning of an IC, it is important for IC designers to determine the timing characteristics associated with interconnect structures in ICs. Timing characteristics of an interconnect structure, for purposes of the present application, include distributed capacitance and resistance of the interconnect structure and signal propagation delay through the interconnect structure. A reliable method for estimating the timing characteristics of interconnect structures in ICs is important for IC designs because the delay introduced by interconnect structures may be comparable to or longer than delays introduced by active devices. For example, a delay introduced by an interconnect structures as short as 1 mm, with 0.4 μm feature size, in an IC can be comparable to or longer than delays introduced by active devices in the IC. Propagation delays through interconnect structures increase as wiring lengths increase or feature size decreases.

Programmable ICs are programmed to perform desired logic functions. A field programmable gate array (FPGA) is an example of a programmable IC. An FPGA is typically comprised of three major configurable elements: configurable logic blocks (CLBs), input/output blocks (IOBs), and an interconnect network. The CLBs provide the functional elements for constructing the desired logic. The IOBs provide the interface between the package pins and internal signal lines. The interconnect network provides routing paths, programmable intersection points (PIPs), and switch matrices to transfer the input and output signals of the CLBs and IOBs onto the appropriate networks. The CLBs, IOBs, and interconnect network are configured by programming a plurality of internal memory cells.

Prior Art FIG. 1A shows a block diagram of an FPGA 101 including a 4×4 CLB array 102. An FPGA design can have a variable array size (10×10, 12×12, etc.) CLB matrix. The present invention can be applied to suit any CLB array size. A CLB includes multiple elements, such as function generators, flip-flops, buffers, drivers, multiplexers, registers, etc. Refer to U.S. Pat. No. Re.34,363, issued to Freeman on Aug. 31, 1993, and assigned to the assignee of the present invention. Surrounding CLB array 102 are IOBs 103–106 and decoders 107–110. The CLBs, IOBs, and decoders are programmably interconnected by the use of three main types of interconnect lines. Interconnects in FPGAs are typically composed of metal lines. Interconnects are distinguished by the relative length of their lines: single length lines, double length lines, and long lines. The single-length lines are comprised of a grid of horizontal and vertical metal lines that intersect at switch matrices (not shown) between each CLB. The switch matrices are used to establish connections between the single-length lines. The double-length lines (also not shown) consist of a grid of metal segments that are twice as long as the single-length lines. Hence, a double-length line runs past two CLBs before entering a switch matrix. Long lines 121–126 form a grid of metal interconnect segments that substantially run the length or width of FPGA 101. These horizontal and vertical long lines, which bypass the switch matrices, are intended primarily for signals that must travel a long distance, or must have minimum skew among multiple destinations. It is an object of the present invention to provide a method for determining the timing characteristics associated with single length lines, double length lines, and long lines in FPGAs.

Prior Art FIG. 1B shows an exemplary programmable interconnect point (PIP) 181 in an FPGA. The PIP 181 includes a pass transistor 184 having its gate coupled to a memory cell 185. Memory cell 185 can be programmed with a bit that either turns ON or turns OFF pass transistor 184. If turned ON, pass transistor 184 electrically connects lines 182 and 183. If turned OFF, pass transistor 184 does not connect lines 182 and 183.

A dynamic voltage contrast scanning electron microscope (SEM) provides accurate direct measurements of time periods as short in duration as a few hundred picoseconds. Time delays for signals propagating through IC interconnect structures are generally less than a few hundred picoseconds. Therefore, an SEM can provide only limited accuracy in measuring propagation delays through shorter IC interconnect structures. Moreover, an SEM can only be used to measure signal propagation delay through a signal path if it is possible to apply a pair of specialized test probes across the signal path. Using an SEM for this task is costly and time intensive and is therefore not a practical solution for characterizing an IC having thousands of different interconnect segments. The SEM must be able to reach the various signals under test. In a typical multilayer metal IC, only the top layer of metal is accessible. Therefore, test points from the lower layer metals must be introduced and brought to the top layer.

However, propagation delays through inaccessible signal paths may be indirectly measured by an addition/subtraction method. In this method, propagation delays through a multiplicity of accessible overlapping signal paths are directly measured. Then the measured delay times are added and subtracted appropriately to determine a value for propagation delay through the overlapped portions of the signal paths. Although reliable, this method is impractical because of the limited number of signal paths which overlap each other and the complexity of the analysis of those signal paths.

By configuring an FPGA, or other programmable IC appropriately, it is possible to create signal paths which begin and end at known points and which have common signal path segments. Signal propagation delays for each of these paths, beginning and ending at known points, can be measured using an SEM. The measured propagation delays are then added and subtracted to obtain propagation delays for common segments of the signal paths. However, the method of measuring, adding, and subtracting signal propagation delays is very time consuming and economically impractical.

Accordingly, it would be desired to arrive at a method for measuring timing characteristics that could be applied to interconnect segments without requiring an SEM and accessible test points for each interconnect segment. The present invention provides the above advantageous functionality.

SUMMARY OF THE INVENTION

A method is provided for determining timing characteristics of interconnect structures in integrated circuits. In the preferred embodiment of the present invention, an FPGA is configured to implement an n stage reference ring oscillator circuit (RROC) including n configurable logic blocks (CLBs) which are configured to realize inverters, where n is an odd integer. The RROC can be implemented to include any odd integer, n, of inverters and can optionally include a buffer. In one embodiment, six CLBs (five inverters plus one buffer) of the RROC are coupled in a ring with reference interconnect structures coupling the output terminal of each CLB to the input terminal of the next CLB, thereby defining six segments. Each of the six segments of the RROC comprises an interconnect which begins at the output terminal of one CLB and extends to the input terminal of the next CLB in the ring. A test point, which is accessible to specialized test probes, is provided at the input terminal to each stage. Therefore, each of the six segments of the RROC is bounded by an accessible test point. At least one of the six segments has a test programmable interconnection point (test PIP) which couples the reference interconnect structure to a test interconnect structure when the test PIP turns ON. Segments of the RROC having a test PIP are referred to as test segments.

Reference timing characteristics of the n segments are determined for the RROC as the RROC oscillates in an unloaded state with all of the test PIPs turned OFF. Reference timing characteristics of the RROC are determined according to a RROC calibration method comprising the steps of: (a) directly measuring signal propagation delay through each segment of the RROC by applying probes of a scanning electron microscope at each test point; (b) modeling each test segment of the unloaded RROC using a reference circuit model comprising an RC tree network including reference resistors and reference capacitors having values which are representative of the distributed resistance and capacitance of the test segment; (c) simulating the reference circuit models, using a computer implemented simulator, to provide a functional relationship between two reference capacitors; (d) defining the upper and lower bounds for propagation delay through each reference circuit model in terms of the reference elements of the reference circuit models; (e) determining values for the reference capacitor elements and reference resistor elements which model each test segment; and (f) measuring a reference frequency of oscillation, $F_{REF}$, of the unloaded RROC.

After reference timing characteristics are determined for each segment of the unloaded RROC, the RROC is loaded by turning ON one of the test PIPs, thereby placing a test interconnect on a test segment of the RROC. The test interconnect structure, which is loaded onto the test segment, is modeled as a test resistor in series with a test capacitor. A terminal of the model test resistor is coupled to a network node of the RC tree model of the test segment and a terminal of the model test capacitor is coupled to ground.

As the RROC oscillates in a loaded state, a test frequency of oscillation, $F_{TEST}$, of the loaded RROC is measured. A decrease between the measured reference frequency, $F_{REF}$, and the measured test frequency, $F_{TEST}$, is indicative of increased capacitive loading on the RROC as the RROC is loaded by a test interconnect structure. Increased capacitive loading results in an increased period of oscillation and increased signal propagation delay through the loaded test segment of the RROC. Any increased propagation delay through the loaded test segment is attributed to the loading of the test interconnect onto the RROC. An increase in propagation delay, $\Delta T$ through the test segment, as a result of loading a test interconnect onto the test segment, is taken as being equal to an increase in period of oscillation, $\Delta P$, of the RROC which results from the same loading of the test interconnect. Adding the time value, $\Delta P$, to the propagation delay, T, through the unloaded test segment results in a value for the propagation delay, T', through the loaded test segment. Then, upper and lower bounds are determined, for the propagation delay through the test circuit model, in terms of the reference and test elements of the test circuit model. Finally, a value is determined for the test capacitor element which models the distributed capacitance of the test interconnect (e.g., the timing characteristics of the test interconnect).

BRIEF DESCRIPTION OF THE DRAWINGS

The present invention is illustrated by way of example, and not by way of limitation, in the figures of the accompanying drawings and in which like reference numerals refer to similar elements and in which:

Prior Art

Prior Art

FIG. 6 shows a linear circuit model of a first test segment of the exemplary RROC with the first test PIP turned ON.

FIG. 7B shows a linear circuit model of the second test segment of the exemplary RROC with the second test PIP turned ON.

DETAILED DESCRIPTION OF THE INVENTION

Reference will now be made in detail to the preferred embodiments of the invention, examples of which are illustrated in the accompanying drawings.

The method of the present invention utilizes a reference ring oscillator circuit (RROC) to determine timing characteristics associated with test interconnect structures in an integrated circuit. Timing characteristics of an interconnect structure, for purposes of the present application, include distributed capacitance and resistance of the interconnect structure and signal propagation delay through the interconnect structure. Test elements (e.g., test interconnect structures and test PIPs) refer to interconnect elements for which timing characteristics are determined according to the method and apparatus of the present invention. Reference interconnect elements (e.g., reference interconnect structures and reference PIPs) refer to interconnect elements for which timing characteristics are directly measured using a scanning electron microscope. Reference interconnect elements are included in the RROC of the present invention which is used to determine timing characteristics of test interconnect elements (e.g. test interconnect structures).

The method of the present invention is described for application to field programmable gate arrays (FPGAs), however, the method is equally applicable to other programmable integrated circuits such as programmable logic devices (PLDs) and complex programmable logic devices (CPLDs). The present method can also be used to determine the timing characteristics of interconnect structures in other types of integrated circuits as well. The configurable elements of programmable ICs, such as FPGAs, allow for easy implementation of the RROC of the present method.

Figure 1A:
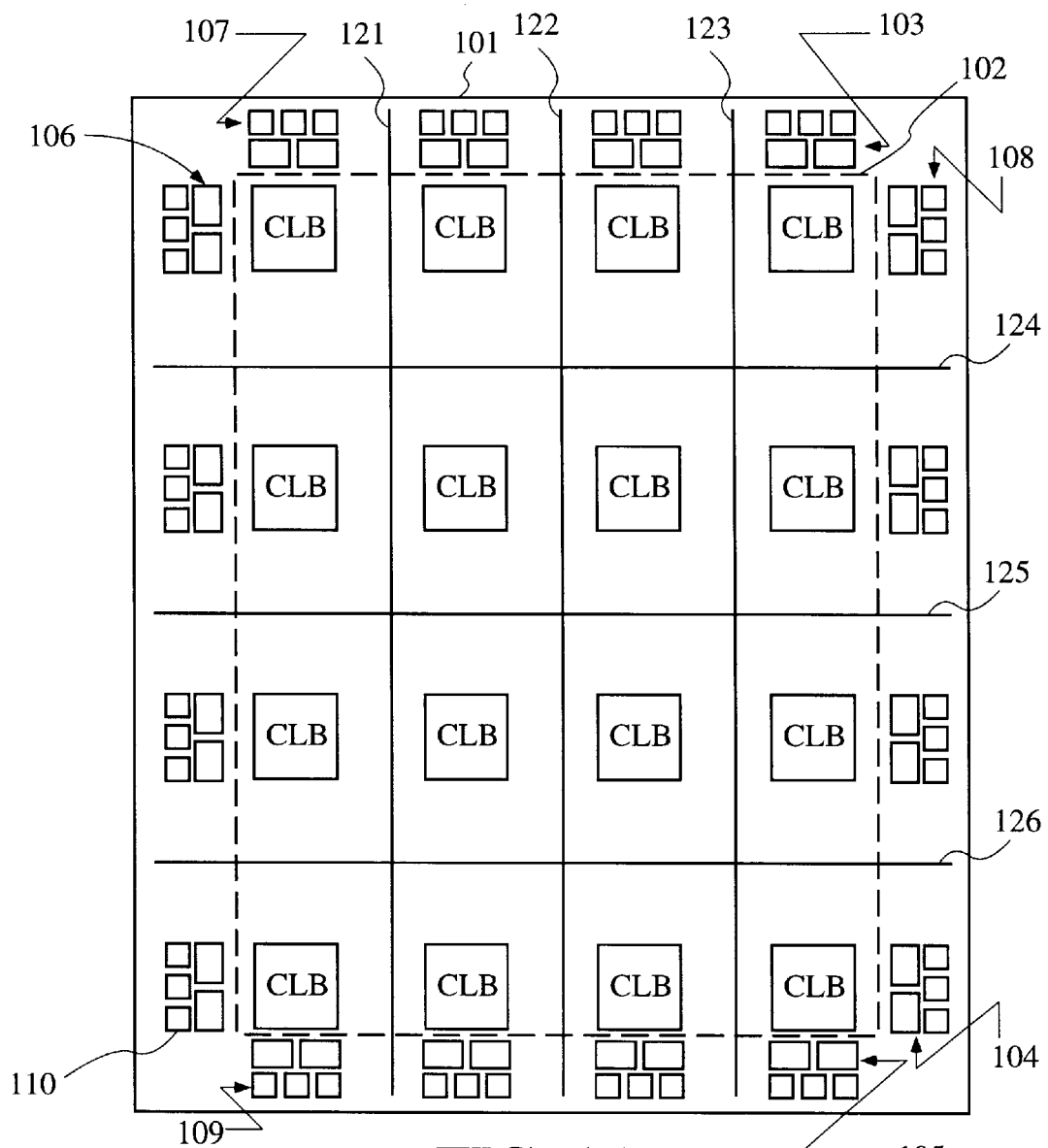
FIG. 1A shows a block diagram of an exemplary field programmable gate array (FPGA) including a 4×4 configurable logic block (CLB) array.
Figure 1B:
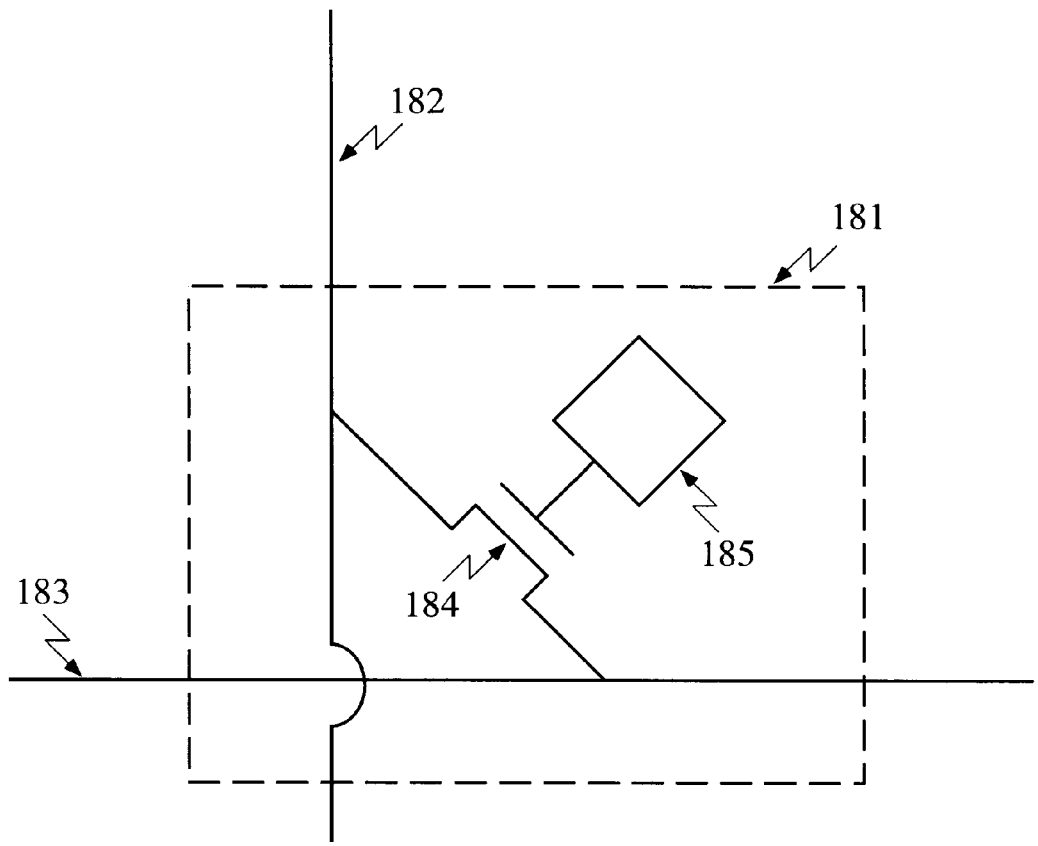
FIG. 1B shows an exemplary programmable interconnect point (PIP) which includes a pass transistor.
Figure 2:
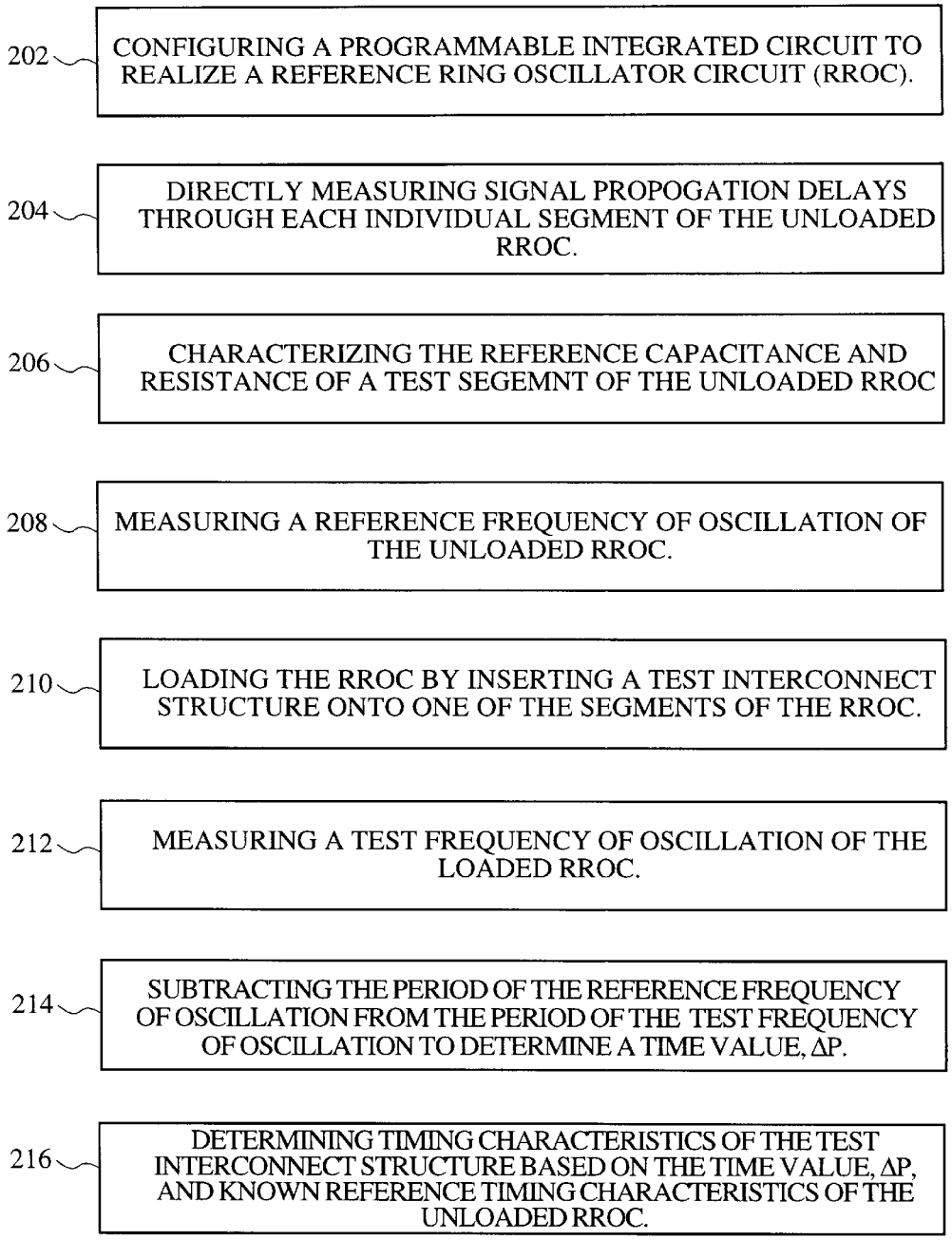
FIG. 2 shows a flow chart illustrating steps of the method of the present invention for measuring timing characteristics of a test interconnect structure.

FIG. 2 shows a flow chart illustrating the steps of the method 200 of the present invention for characterizing test interconnect timing characteristics using a reference ring oscillator circuit. Step 202 calls for configuring a programmable IC to realize a reference ring oscillator circuit (RROC). The RROC is implemented in one embodiment by configuring a field programmable gate array (FPGA). However, as previously mentioned, the RROC may be implemented with other programmable integrated circuits as well.

Figure 3:
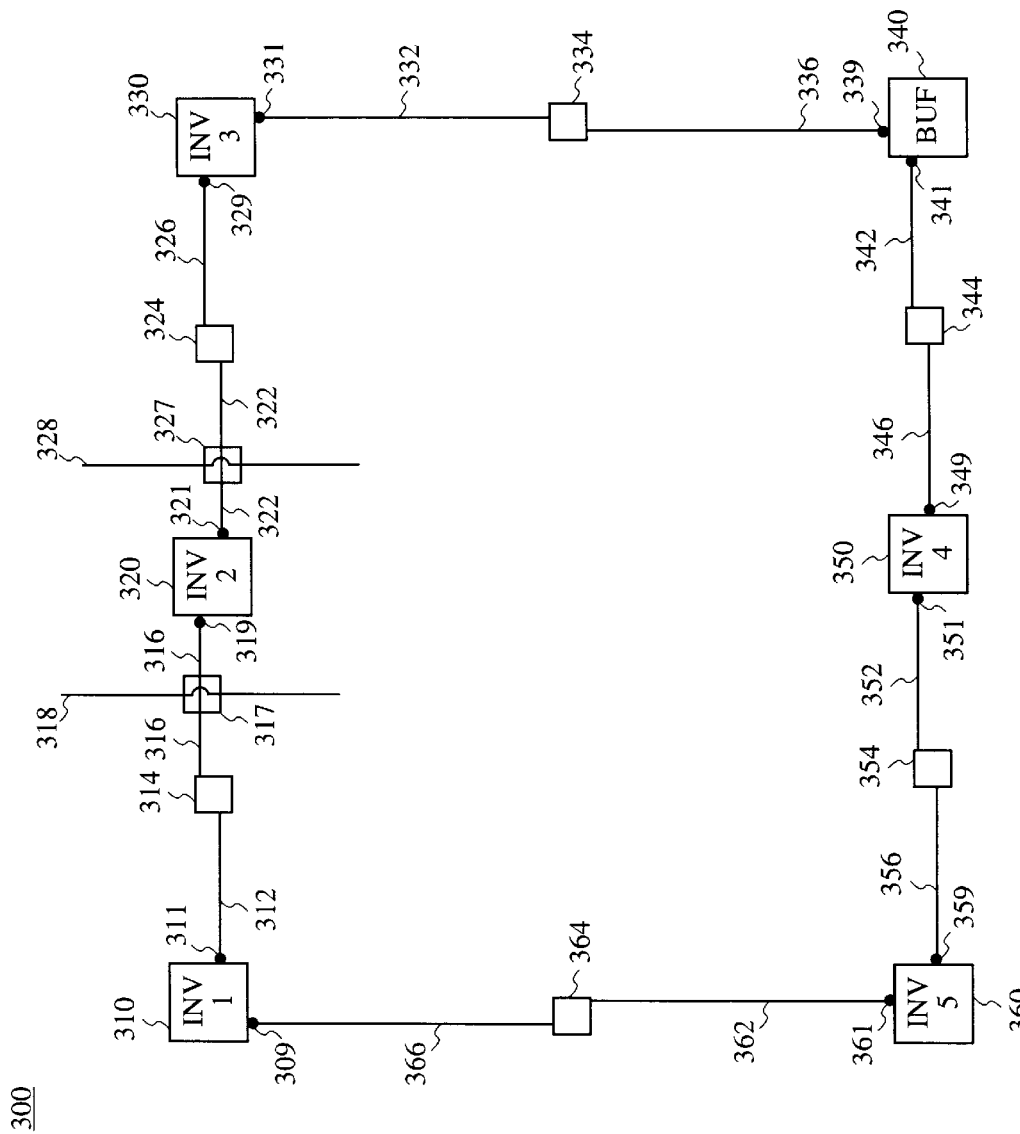
FIG. 3 shows a circuit block diagram of an exemplary reference ring oscillator circuit (RROC) according to the method of the present invention.

FIG. 3 shows an exemplary six stage reference ring oscillator circuit (RROC) 300 according to step 202 of the method of the present invention. The exemplary RROC 300 includes five inverter stages 310, 320, 330, 350, 360 (n=5) and a buffer stage 340 coupled together using reference interconnects and reference PIPs. However, the RROC 300 can be implemented to include any odd integer, n, of inverters with the buffer 340 being optional. Each of the inverters 310, 320, 330, 350, 360 and the buffer 340 are implemented in the preferred embodiment with configurable logic blocks (CLBs) of an FPGA using well known techniques and circuits.

Referring to FIG. 3, a first inverter 310 has an output terminal 311 coupled to a first reference PIP 314 by a first reference interconnect 312. The first reference PIP 314 is coupled to an input terminal 319 of a second inverter 320 by a second reference interconnect 316. A first test PIP 317 has a pass transistor which couples the second reference interconnect 316 to a first test interconnect 318 when the pass transistor of test PIP 317 is turned on. An output terminal 321 of the second inverter 320 is coupled to a second reference PIP 324 by a reference interconnect 322. The second reference PIP 324 is also coupled to an input terminal 329 of a third inverter 330 by a reference interconnect 326. A second test PIP 327 has a pass transistor which couples the reference interconnect 322 to a second test interconnect 328 when the pass transistor of the second test PIP 327 is turned on. An output terminal 331 of the third inverter 330 is coupled to a third reference PIP 334 by a reference interconnect 332. The third reference PIP 334 is also coupled to the input terminal of a buffer 340 by a reference interconnect 336. An output terminal 341 of the buffer 340 is coupled to a fourth reference PIP 344 by a reference interconnect 342. The fourth reference PIP 344 is also coupled to an input terminal 349 of a fourth inverter 350 by a reference interconnect 346. An output terminal 351 of the fourth inverter 350 is coupled to a fifth reference PIP 354 by a reference interconnect 352. The fifth reference PIP 354 is coupled to the input terminal of a fifth inverter 360 by a reference interconnect 356. An output terminal 361 of the fifth inverter 360 is coupled to a sixth reference PIP 364 by a reference interconnect 362. The sixth reference PIP 364 is coupled to an input terminal 309 of the first inverter 310 by a reference interconnect 366.

With reference still to FIG. 3, each of the reference PIPs 314, 324, 334, 344, 354, 364 has a pass transistor which is turned ON to allow current to flow through each of the six CLBs 310, 320, 330, 340, 350, 360 forming the exemplary RROC 300 In this state, if test PIPs 317, 327 are both turned OFF, the RROC 300 oscillates in an unloaded state. When at least one test PIP 317, 327 is turned ON, the RROC 300 is loaded by at least one test interconnect structure 318, 328 and the RROC 300 is said to be in a loaded state. Any one of the twelve reference interconnects 312, 316, 322, 326, 332, 336, 342, 346, 352, 356, 362, 366 may be coupled to a test interconnect structure by a test PIP. The test interconnect structures 318, 328 can include an interconnect wire (e.g., single length line, longline, etc.) or any active device on the substrate of an integrated circuit.

Six segments of the RROC 300 are defined. Each of the six segments of the RROC 300 comprises a signal path which begins at a CLB output terminal 311, 321, 331, 341, 351, 361 of one stage and extends to a CLB input terminal 319, 329, 339, 349, 359, 309, respectively, of the next stage in the ring. For example, a first segment of the exemplary RROC 300 begins at the CLB output terminal 311 of CLB 310 and ends at the CLB input terminal 319 of the next CLB 320. Test points, which are accessible to test probes (not shown), are provided at the input terminals 309, 319, 329, 339, 349, 359 and at the output terminals 311, 321, 331, 341, 351, 361 of each stage of the RROC 300. Segments of the RROC 300 having a test PIP are referred to as test segments of the RROC 300. Although there are only two test interconnect structures 318, 328 shown in the exemplary RROC 300, every segment of the RROC 300 can be a test segment having a test PIP which couples a test interconnect structure to the segment.

Reference timing characteristics, including signal propagation delay and distributed capacitance, are determined for the RROC 300 by direct measurement as the RROC 300 oscillates in an unloaded state with all of the test PIPs turned OFF. The reference timing characteristics of the RROC 300 must be determined before the RROC 300 is loaded with a test interconnect structure. Referring back to FIG. 2, steps 204, 206, and 208 of the method 200 of the present invention are then carried out in order to determine the reference timing characteristics of the RROC 300. Steps 204, 206, and 208, which are described below in detail, comprise a calibration procedure for calibrating the timing characteristics of the six segments of the RROC 300.

Step 204 of the method 200 of the present invention calls for directly measuring signal propagation delays through each individual segment of the unloaded RROC. This step is accomplished in the preferred embodiment by using a scanning electron microscope (SEM) in a well known fashion, but other time delay measuring test instruments can be used. In a preferred embodiment of the present invention, a dynamic voltage contrast SEM is used. Referring to FIG. 3, test probes of an SEM are placed at each accessible test point at each CLB input terminal 309, 319, 329, 339, 349, 359 and at each CLB output terminal 311, 321, 331, 341, 351, 361 of each CLB 310, 320, 330, 340, 350, 360. Signal paths through each CLB 310, 320, 330, 340, 350, 360 begin at the CLB input terminals 309, 319, 329, 339, 349, 359 and end at the corresponding CLB output terminals 311, 321, 331, 341, 351, 361. As previously mentioned, segments of the RROC 300 begin at the CLB output terminals 311, 321, 331, 341, 351, 361 and end at the input terminals 319, 329, 339, 349, 359, 309 of the next CLB respectively. The SEM is used to determine propagation delays through each CLB 310, 320, 330, 340, 350, 360 of the RROC 300 and through each segment of the RROC 300.

Figure 4:
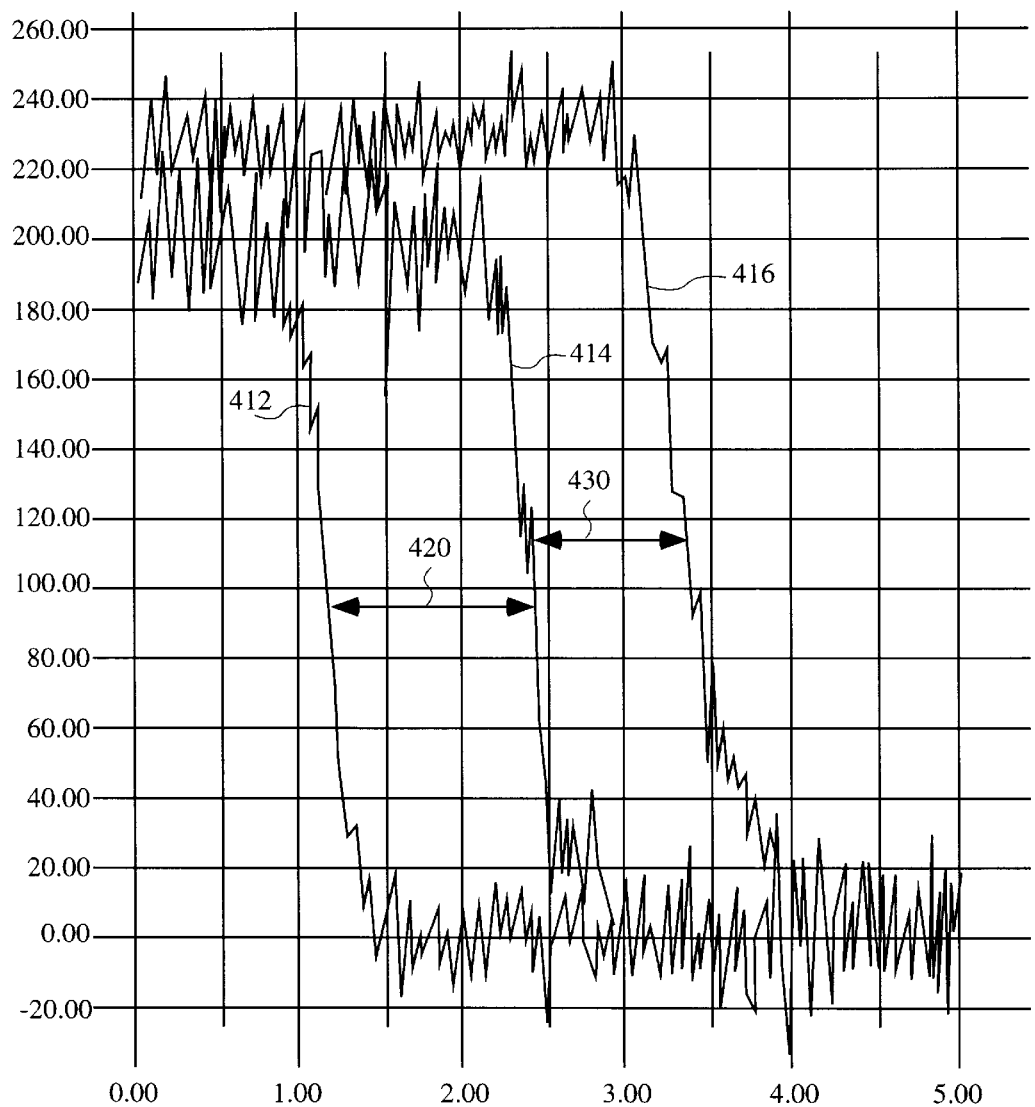
FIG. 4 shows propagation delay data, measured using an SEM, for a signal propagating through a configurable logic block and a reference interconnect.

FIG. 4 shows propagation delay data measured with the SEM having test probes placed on the test points on the RROC 300 (FIG. 3). Specifically, FIG. 4 is a graph with voltage units on the vertical axis and time units on the horizontal axis. A signal trace 412 shows a voltage transition at a test point at the input terminal 309 of inverter 310 (FIG. 3). A signal trace 414 shows a voltage transition at a test point at the output terminal 311 of the first CLB (inverter) 310 (FIG. 3). A signal trace 416 shows a voltage transition at a test point at the input terminal 319 of the second inverter 320 (FIG. 3). A time differential 420 between the signal traces 412 and 414 is called "tilo" and it represents the signal propagation delay through the first CLB (inverter) 310. A time differential 430 between the signal traces 414 and 416 represents the signal propagation delay through the first segment of the RROC 300 which begins at the output terminal 311 of the first CLB (inverter) 310 and ends at the input terminal 319 of the second CLB (inverter) 320 (FIG. 3).

Figure 5A:
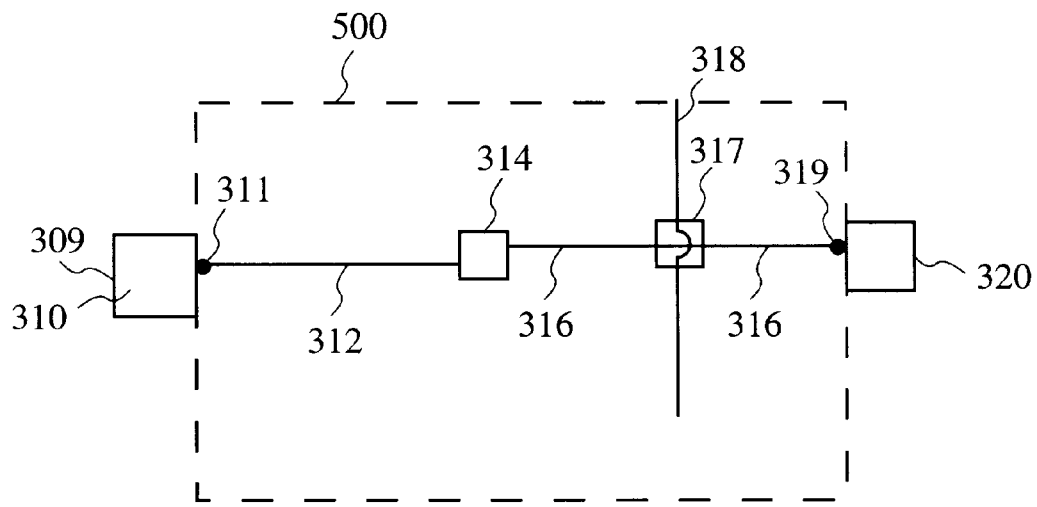
FIG. 5A shows an isolation view of a first test segment of the exemplary RROC.
Figure 5B:
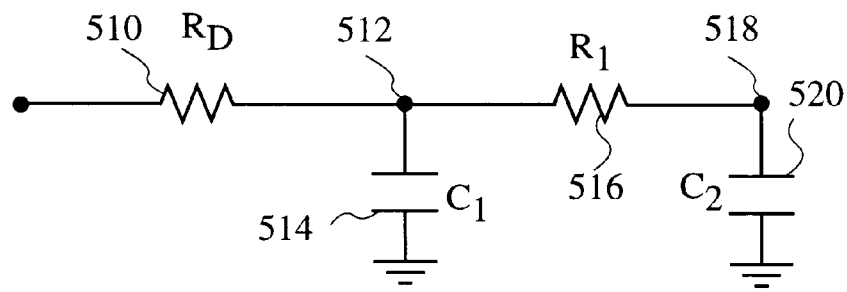
FIG. 5B shows a linear circuit model of the first test segment of the exemplary RROC with the first test PIP turned OFF.

With reference to FIG. 5, assuming that all test PIPs 317, 327 are turned OFF, each discrete segment of the RROC 300 can be modeled by a reference circuit model 501 shown in FIG. 5B. Steps for determining the timing characteristics of the first and second test interconnect structures 318, 328 are described below.

Step 206 of the method 200 of the present invention calls for characterizing the reference capacitance and reference resistance of each test segment of the unloaded RROC 300 (FIG. 3).

FIG. 5A shows an isolation view of a first test segment 500 of the RROC 300 (FIG. 3). The first test segment 500 of the RROC 300 includes reference interconnects 312 and 316, reference PIP 314, and test PIP 317. The first test segment 500 of the RROC 300 is bounded by the output terminal 311 of the first inverter 310 and the input terminal 319 of the second inverter 320.

In order to characterize the reference capacitance and reference resistance of each test segment, each test segment of the RROC 300 is modeled by a linear circuit model comprising an RC tree network. FIG. 5B shows a schematic diagram for a reference circuit model 501 for the first test segment 500 (FIG. 5A) with the first test PIP 317 turned OFF. The reference circuit model 501 includes lumped circuit elements which model the distributed resistance and capacitance along the first test segment 500 (FIG. 5A). Note that any nonlinear capacitances in the signal path are approximated by linear ones. The output resistance of the first inverter 310 is modeled by a first reference resistor 510 having a resistance value, $R_D$, which is known or can be directly measured. A terminal of the first reference resistor 510 is connected to a first network node 512. A first reference capacitor 514 having a capacitance value $C_1$ is coupled between the first network node 512 and ground. The first reference capacitor 514 models a capacitance seen by the first inverter 310 from the most immediate portion of the external load on the first inverter 310 (FIG. 5A). This capacitance is due mainly to parasitic capacitance on the first reference interconnect 312 which is coupled to the output terminal 311 of the first inverter 310 (FIG. 5A). A second reference resistor 516 having a resistance value R1 is coupled between the first network node 512 and a second network node 518. The second reference resistor 516 models the known resistance of the pass transistor of the first reference PIP 314. A second reference capacitor 520 is coupled between the second network node 518 and ground. The second reference capacitor 520 models the distributed capacitance of the second reference interconnect 316.

To determine the timing characteristics of the first test segment 500, values for each of the reference elements 510, 514, 516, and 520 must be determined. The values of the first and second reference resistors 510 and 516 are known or can readily be determined. Capacitance values $C_1$ and $C_2$ for the first and second reference capacitors 514, 520 are determined according to a numerical method. The first step in the numerical method is to simulate the linear circuit model of FIG. 5B using a simulation program such as SPICE. The functional relationship between capacitance values $C_1$ and $C_2$, as determined by computer simulation, is expressed by relationship (1):

$$C_1 = Y^* C_2 \tag{1}$$

where Y is known or readily determined based on the above simulation.

The next step in the numerical method is to express the signal propagation delay through test segment 500 in terms of the resistance and capacitance values of the elements of the circuit model 501 of FIG. 5B. Reference circuit model 501 comprises an RC tree network. An RC tree network may be defined recursively as follows. There are three primitive elements. First, a lumped capacitor between ground and another node is an RC tree. Second, a lumped resistor between two non ground nodes is an RC tree. Third, a (distributed) RC line, uniform or non uniform, in the configuration with no DC path to ground, is an RC tree. Finally, any two trees with common ground, and one non ground node from each connected together, form a new RC tree. All of the capacitors of RC tree networks are connected to ground. According to this definition, reference circuit model 501 is an RC tree network.

One known method (hereinafter referred to as the Penfield-Rubinstein method) estimates signal propagation delay in RC tree networks in terms of modeled lumped resistance and capacitance values. IEEE Transactions on Computer-Aided Design, Vol. CAD-2, No. 3, July 1983.

In the method 200 of the present invention, Penfield-Rubinstein relationships, (2) and (3) below, are used to define the upper and lower time bounds, $T_{max}$ and $T_{min}$, for the propagation delay of a signal propagating through the linear circuit model 501 of FIG. 5B;

$$T_{max} = (t_p - t_r) + t_p * \ln(t_d / (t_p * 0.05)) \tag{2}$$

$$T_{min} = t_r * \ln(t_d / (t_p * 0.05)) \tag{3}$$

wherein $t_p$, $t_r$, and $t_r$ are defined, in terms of the reference circuit element values of the reference circuit model 501 of FIG. 5B, by Penfield-Rubinstein relationships (4), (5), and (6);

$$t_p = (R_D * C_1) + (R_D + R_1) * C_2 \tag{4}$$

$$t_r = (R_D^2 * C_1 + (R_D + R_1)^2 * C_2) / (R_D + R_1) \tag{5}$$

$$t_d = (R_D * C_1) + (R_D + R_1) * C_2 = t_p \tag{6}$$

The Penfield-Rubinstein relationship (7), below, expresses the relationship between the measured signal propagation delay, T, through test segment 500 and the upper and lower bounds of propagation delay through test segment 500 expressed in relationships (2) and (3):

$$T = (T_{min} + T_{max})/2 \quad (7)$$

Substituting relationships (4), (5), and (6) into relationship (7) results in a single relationship which is a function of two unknowns, $C_1$ and $C_2$. Relationship (1) provides a second relationship which is a function of $C_1$ and $C_2$. Relationships (1) and (7) are then used to numerically solve for the capacitance value $C_1$ of the first reference capacitor 514 and the capacitance value $C_2$ of the second reference capacitor 516. This step of numerically solving for $C_1$ and $C_2$ using the above relationships can be accomplished using a general purpose computer system using well known techniques.

Referring back to FIG. 2, step 208 of the method of the present invention requires measuring a first reference frequency of oscillation of the unloaded RROC 300. As the RROC 300 oscillates in the unloaded state, a reference frequency of oscillation, $F_{REF}$, is measured with a frequency meter using well known techniques and components.

Step 210 of FIG. 2 of the method 200 of the present invention calls for loading the RROC 300 by inserting a test interconnect structure onto one of the test segments of the RROC 300. When at least one test PIP 317, 327 is turned ON, the RROC 300 is loaded by at least one test interconnect structure 318, 328 respectively and the RROC 300 is said to be in a loaded state.

Figure 6:
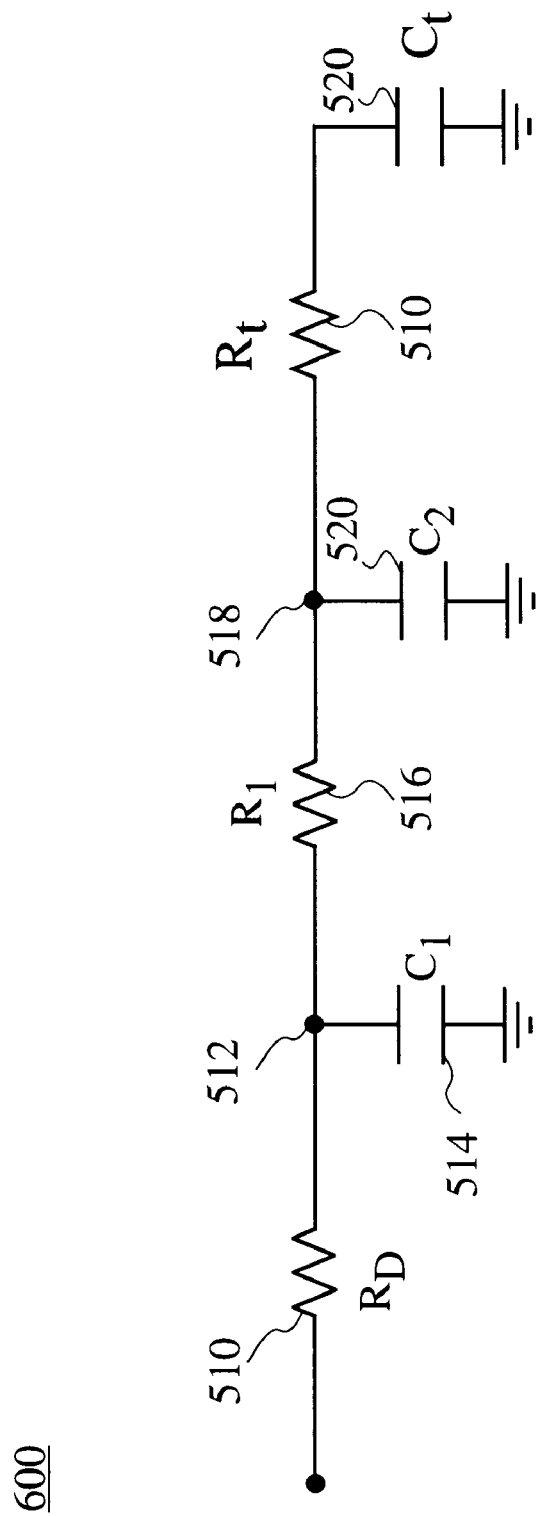

FIG. 6 shows a schematic diagram for a linear circuit model 600 of the test segment 500 while the first test PIP 317 is turned ON (FIG. 5A). The linear circuit model 600 includes the four reference elements 510, 514, 516, 520 of FIG. 5B which comprise the reference circuit model 501 (which models the test segment 500 while the first test PIP 317 is turned OFF (FIG. 5A)). Circuit model 600 also includes test capacitance element 620 and test resistor element 610 to model the test interconnect 318 added to the test segment 500.

Referring to FIG. 6, the four reference elements 510, 514, 516, 520 are coupled together in the form of an RC tree network as described in FIG. 5B. With reference again to FIG. 5A, when the first test PIP 317 is turned ON, the first test interconnect 318 is loaded onto the RROC 300. As a result, additional capacitance and resistance is loaded onto the RROC 300. With reference back to FIG. 6, the linear circuit model 600 models the distributed resistance and capacitance of the test interconnect 318 as a test resistor 610 in series with a test capacitor 620. A first terminal of the test resistor 610 is coupled to the second network node 518. The test resistor 610, having a known resistance value $R_t$, is coupled to a first terminal of a test capacitor 620, having a capacitance value $C_t$ (to be determined). A second terminal of the test capacitor 620 is coupled to ground.

When test PIP 317 is turned ON, the measured frequency of oscillation of the RROC 300 decreases and the measured propagation delay through the test segment 500 increases. While the RROC 300 is loaded, a test frequency of oscillation, $F_{TEST}$, is measured in accordance with step 212 of the present method (FIG. 2) using well known techniques and components. A resulting decrease between the measured reference frequency, $F_{REF}$, and the measured test frequency, $F_{TEST}$, is indicative of increased capacitive and resistive loading on the RROC 300 as the RROC 300 is loaded by test interconnect structure 318. Increased capacitive and resistive loading increases the period of oscillation as well as signal propagation delay through the RROC 300.

Step 214 of the present invention calls for subtracting the reference period of oscillation from the test period of oscillation to determine a time value, $\Delta P$. Relationship (8), below, expresses the increase in period of oscillation of the RROC 300 in response to loading test interconnect 318 onto the RROC 300 by turning test PIP 317 ON:

$$P' = P + \Delta P \quad (8)$$

where P is the reference period of oscillation of the unloaded RROC 300, P' is the test period of oscillation of the RROC 300 measured while the RROC 300 is loaded by test interconnect 318, and $\Delta P$ is the increase in period of oscillation of the RROC 300 in response to loading test interconnect 318 onto the RROC 300 by turning test PIP 317 ON.

Step 216 of the present invention calls for determining timing characteristics of a test interconnect structure based on the time value, $\Delta P$, and known reference timing characteristics of the unloaded RROC 300. This step is accomplished as described below.

Relationship (9), below, expresses the relationship between the increase in propagation delay, T, through test segment 500 (as a result of turning test PIP 317 ON) and the increase in the period of oscillation of the RROC 300 (as a result of turning ON test PIP 317):

$$T' = T + \Delta T = T + \Delta P \quad (9)$$

where T is the measured propagation delay through test segment 500 with test PIP 317 OFF, T' is the increased propagation delay through test segment 500 with test PIP 317 ON, and $\Delta P$ is the increase in period of oscillation of the RROC 300 in response to loading test interconnect 318 onto the RROC 300. In relationship (9), it is assumed that the increase, $\Delta P$, in period of oscillation is numerically equal to the increase in propagation delay, $\Delta T$, through the test segment 500. Thus, a value is determined for the signal propagation delay, T', through test segment 500 with test PIP 317 ON.

As noted previously in reference to FIG. 6, the resistance value Rt can readily be measured or is known and the capacitance value, Ct, for the test interconnect 318 can be determined according to a numerical method. The value of T', determined using relationship (9), is substituted into relationship (7) resulting in relationship (10):

$$T' = (T_{min} + T_{max})/2 \quad (10)$$

As discussed above, Penfield-Rubinstein relationships can be used to define upper and lower bounds for the delay of a signal traveling through a RC tree network like the network of FIG. 6. Relationships (2) and (3) define the upper and lower bounds for the propagation delay of a signal traveling through the linear circuit model 600 of FIG. 6:

$$T_{max} = (t_p - t_r) + t_p * \ln(t_d/(t_p*0.05)) \quad (2)$$

$$T_{min} = t_r * \ln(t_d/(t_p*0.05)) \quad (3)$$

wherein $t_p$, $t_r$, and $t_d$ are defined, in terms of the circuit element values of the circuit model 600 of FIG. 6, by relationships (11), (12), and (13):

$$t_p = (R_D*C_1) + (R_D+R_1)*C_2 + (R_D+R_1+R_t)*C_T \quad (11)$$

$$t_r = (R_D{}^2*C_1 + (R_D+R_1)^2*C_2 + (R_D+R_1+R_t)^2*C_T)/(R_D+R_1+R_t) \quad (12)$$

$$t_d = (R_D*C_1) + (R_D+R_1)*C_2 + (R_D+R_1+R_t)*C_T = t_p \quad (13)$$

Substituting relationships (11), (12), and (13) into relationship (10) results in a single relationship which is a function of only one unknown, $C_T$, which can be solved by a closed form solution using well known numerical methods on a computer system. The value determined for $C_T$ represents the capacitance of the first test interconnect 318. The values of $R_t$ and $C_t$ can be stored into a computer memory and associated (e.g., indexed) with test interconnect 318 for future reference and use.

Figure 7A:
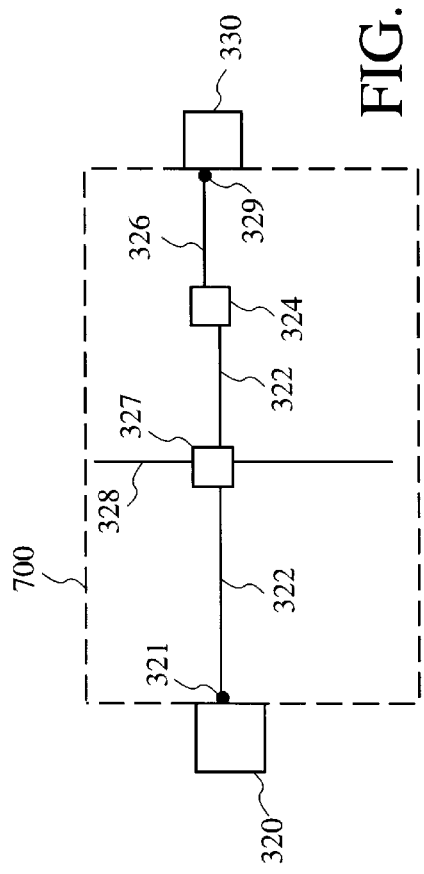
FIG. 7A shows an isolation view of a second test segment of the exemplary RROC.

FIG. 7A shows an isolation view of a second test segment 700 of the RROC 300 (FIG. 3). Referring to FIG. 7A, the second test segment 700 includes the reference interconnects 322 and 326, the second test PIP 327, and the second reference PIP 324. The second test segment 700 of the RROC 300 is bounded by the output terminal 321 of the second inverter 320 and the input terminal 329 of the third inverter 330. As previously discussed, the second test PIP 327 has a pass transistor which couples the reference interconnect 322 to the test interconnect 328 when the pass transistor of second test PIP 327 is turned ON. Structurally, the second test segment 700 is similar to the first test segment 500 except that the location of the test PIP and the reference PIP are switched. If both test PIPs 317, 327 are turned OFF, the second test segment 700 can be modeled by the same linear RC tree reference circuit model 501 which is used to model the first test segment 500 (FIG. 5B).

In order to characterize the capacitance of the second test interconnect 328 (FIG. 3), steps 206, 210, 212, 214, and 216 of the present method are applied to test segment 700 while test interconnect 328 is the sole test interconnect coupled to RROC 300. Note that steps 202, 204 and 208 are not repeated since steps 202, 204 and 208 are carried out while the RROC 300 is not loaded by any test interconnects.

Figure 7B:
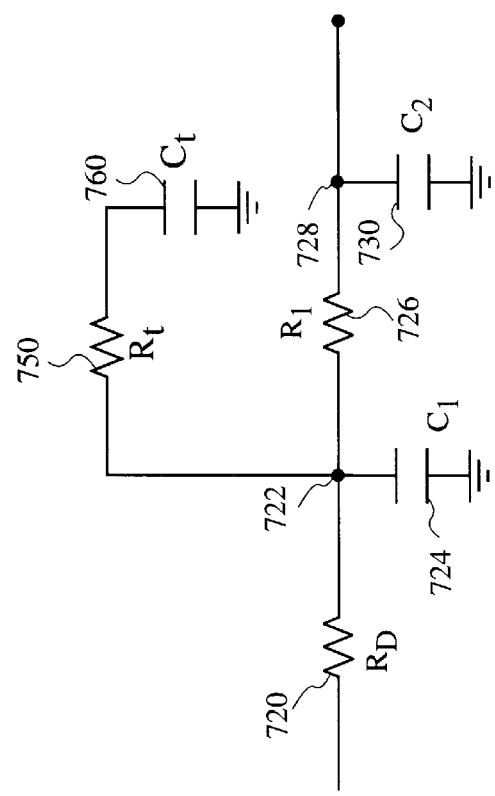

FIG. 7B is a schematic diagram of a linear circuit model of the test segment 700 with the first test PIP 317 turned OFF and the second test PIP 327 turned ON. (FIG. 7A). The circuit model of FIG. 7B includes lumped circuit elements which model the distributed resistance and capacitance along the test segment 700. Any nonlinear capacitances in the test segment are approximated by linear ones. The linear circuit model of FIG. 7B includes four reference elements 720, 724, 726, 730 which are coupled in the same manner as the four reference elements of FIG. 5B (FIGS. 5A and 5B). Specifically, a terminal of the first reference resistor 720 is connected to a first network node 722. The first reference capacitor 724 is coupled between the first network node 722 and ground. The second reference resistor 726 is coupled between the first network node 722 and a second network node 728. The second reference capacitor 730 is electrically coupled between the second network node 728 and ground.

The first reference resistor 720, having a resistance value $R_D$, represents the output resistance of the second inverter 320 (FIG. 7A). The first reference capacitor 724 has a capacitance value $C_1$ and models a capacitance seen by the second inverter 320 from the most immediate portion of the external load on the second inverter 320 (FIG. 7A). This capacitance, $C_1$, is due mainly to parasitic capacitance on the reference interconnect 322 which is coupled to the output terminal of the second inverter 320 (FIG. 7A) The second reference resistor 726, having a resistance value $R_1$, models the known resistance of the pass transistor of the second reference PIP 324. (FIG. 7A). The second reference capacitor 730, having a capacitance value $C_2$, models the distributed capacitance of the fourth reference interconnect 326 (FIG. 7A). The linear circuit model of FIG. 7B models the resistance and capacitance of the second test interconnect 328 as a test resistor in series with a test capacitor. A first terminal of the test resistor 750 is coupled to the first network node 722. The test resistor 750, having a resistance value $R_t$, is coupled to a first terminal of a test capacitor 760 which has a capacitance value $C_t$ (to be determined). A second terminal of the test capacitor 750 is coupled to ground.

After modeling the second test segment 700 (FIGS. 7A and 7B), steps 206, 210, 212, 214, and 216 of the present method are applied to the second test segment 700 to characterize the capacitance of test interconnect 328. These steps are carried out for test segment 700 in analogous fashion as described above for test segment 500 except that relationships (11), (12), and (13) used in step 216 above are replaced by relationships (14), (15), and (16) below:

$$t_p = (R_D * C_1) + (R_D + R_1) * C_2 + (R_D + R_1 + R_t) * C_T + (R_D + R_t) * C_t \quad (14)$$

$$t_r = (R_D^2 * C_1 + (R_D + R_1)^2 * C_2 + (R_D + R_1 + R_t)^2 * C_T + R_D^2 * C_t)/(R_D + R_1 + R_t) \quad (15)$$

$$t_d = (R_D * C_1) + (R_D + R_1) * C_2 + (R_D + R_1 + R_t) * C_T + R_D * C_t \quad (16)$$

The above process allows for the determination of $C_t$, the capacitance of test interconnect 328, via well known numeric methods. The determined value of $C_t$ and the value $R_t$ can then be stored and referenced with the particular test interconnect 328 for later reference.

Within a programmable integrated circuit, it is appreciated that numerous RROCs 300 consistent with the present invention can be positioned about the device, thereby allowing ready access to a wide range of interconnect test structures. Each test interconnect structure can individually be coupled to a segment of the RROC 300 with its timing characteristics determined using method 200 of the present invention. In this manner, the timing characteristics of a substantial number of interconnect structures can be determined and catalogued for later use. It is appreciated that in each example shown above, the RROC 300 is dispersed on the same substrate as the test interconnect structure measured.

The present invention, a method of measuring timing characteristics of a test interconnect using a reference ring oscillator circuit, is thus described. While the present invention has been described in particular embodiments, it should be appreciated that the present invention should not be construed as limited by such embodiments. On the contrary, the invention is intended to cover alternatives, modifications and equivalents, which may be included within the spirit and scope of the invention as defined by the below claims.

What is claimed is:

1. A method of determining interconnect timing characteristics of a test interconnect structure, the method comprising:

a. determining a first timing characteristic of a reference logic unit and a reference interconnect structure;

b. connecting the test interconnect structure to the reference interconnect structure;

c. measuring a second timing characteristic of the reference logic unit and reference interconnect structures connected to the test interconnect structure;

d. comparing the first and second timing characteristics to determine a time value; and e. determining the interconnect timing characteristics of the test interconnect structure based on the time value and the first and second timing characteristics of the reference interconnect structure;

f. wherein the timing characteristics of the test interconnect structure represent capacitance values based on an interconnect model representative of the test interconnect structure.

2. The method of claim 1, wherein the test interconnect structure includes a programmable pass transistor.

3. A method of determining timing characteristics of a test interconnect structure, the method comprising:
   a. configuring a programmable integrated circuit to include a reference oscillator that includes a reference interconnect structure;
   b. measuring a first oscillation frequency of the reference oscillator;
   c. connecting the test interconnect structure to the reference interconnect structure, thereby imposing a load on the reference interconnect structure;
   d. measuring a second oscillation frequency of the reference oscillator, the second oscillation frequency differing from the first oscillation frequency by a frequency difference proportional to the load imposed by the test interconnect structure on the reference interconnect structure; and
   e. calculating the load imposed by the test interconnect structure on the reference interconnect structure based on the frequency difference.

4. The method of claim 3, wherein the load comprises a resistance and a capacitance.

5. The method of claim 3, wherein the frequency difference is obtained by subtraction.

6. The method of claim 3, wherein the reference interconnect structure includes a reference capacitance value, the method further comprising directly measuring the reference capacitance value.

7. The method of claim 3, further comprising directly measuring a signal propagation delay through the reference interconnect structure.

8. The method of claim 3, further comprising modeling the reference interconnect structure using a reference circuit model.

9. The method of claim 3, wherein the reference interconnect structure is one of a plurality of such structures on the programmable integrated circuit.

10. The method of claim 8, wherein the reference circuit model comprises an RC tree network.

* * * * *